(12) United States Patent
Chu et al.

(10) Patent No.: US 8,502,444 B2
(45) Date of Patent: Aug. 6, 2013

(54) ORGANIC LIGHT EMITTING DIODE DISPLAY INCLUDING COLOR FILTERS AND DISPARITY BARRIER PATTERN

(75) Inventors: Chang-Woong Chu, Yongin (KR); Sang-Soo Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/137,910

(22) Filed: Sep. 21, 2011

(65) Prior Publication Data

US 2012/0104938 A1 May 3, 2012

(30) Foreign Application Priority Data

Oct. 29, 2010 (KR) .................. 10-2010-0106888

(51) Int. Cl.
*H05B 33/12* (2006.01)

(52) U.S. Cl.
USPC .............. 313/504; 313/506; 313/507; 445/24

(58) Field of Classification Search
CPC ............. G02B 27/2214; H01L 21/00; H04N 2013/0465
USPC ....... 313/498–512; 257/40, 269; 315/169.1, 315/169.3; 438/26–29, 34, 82
See application file for complete search history.

(56) References Cited

U.S. PATENT DOCUMENTS

| | | | |
|---|---|---|---|
| 6,392,690 B1 * | 5/2002 | Fujii et al. | 348/59 |
| 7,345,659 B2 | 3/2008 | Chang | |
| 7,813,042 B2 * | 10/2010 | Mather et al. | 359/619 |
| 2010/0321621 A1 * | 12/2010 | Kikuchi et al. | 349/122 |
| 2011/0006327 A1 * | 1/2011 | Park et al. | 257/98 |
| 2011/0032456 A1 * | 2/2011 | Nakano et al. | 349/96 |

FOREIGN PATENT DOCUMENTS

| | | |
|---|---|---|
| KR | 10-2007-0023849 A | 3/2007 |
| KR | 10-2008-0030175 A | 4/2008 |
| KR | 10-2010-0030865 A | 3/2010 |
| KR | 10-2010-0031242 A | 3/2010 |

* cited by examiner

*Primary Examiner* — Tracie Y Green
(74) *Attorney, Agent, or Firm* — Lee & Morse, P.C.

(57) ABSTRACT

An organic light emitting diode (OLED) display includes a first substrate, a plurality of organic light emitting elements on the first substrate, and a second substrate facing the first substrate and spaced apart from the first substrate. The plurality of organic light emitting elements is interposed between the first substrate and the second substrate. The OLED display includes a plurality of color filters in at least one of an area between the second substrate and the organic light emitting elements, and an area between the first substrate and the organic light emitting elements. The OLED also includes a disparity barrier pattern on at least one of a surface of the second substrate that opposes one surface of the second substrate facing the first substrate, and a surface of the first substrate that opposes one surface of the first substrate facing the second substrate.

20 Claims, 5 Drawing Sheets

ORGANIC LIGHT EMITTING DIODE DISPLAY INCLUDING COLOR FILTERS AND DISPARITY BARRIER PATTERN

BACKGROUND

1. Field

Embodiments relate to an organic light emitting diode (OLED) display. More particularly, embodiments relate to an OLED display capable of displaying a three-dimensional (3D) image.

2. Description of the Related Art

An organic light emitting diode (OLED) display may have self-luminous characteristics, and may not include a separate light source like a liquid crystal display (LCD). As compared to the LCD device, the OLED device may achieve a reduction in thickness and weight.

Display devices capable of displaying a more realistic three-dimensional (3D) image are in increasing demand. A 3D image may be displayed by on a display device by, e.g., using a method of allowing an image to be separately recognized by the left eye and the right eye of a user viewing the display device. For example, a 3D image may be implemented by causing a disparity in an image displayed by a display device. In order to display a 3D image, an OLED display may include additional components, which may bring about complicated configuration and increases in thickness and weight thereof.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode (OLED) display that effectively displays a three-dimensional (3D) image through a simple configuration.

An exemplary embodiment provides an organic light emitting diode (OLED) display including a first substrate, a plurality of organic light emitting elements formed on the first substrate, a second substrate facing the first substrate to be spaced apart from each other while having the plurality of organic light emitting elements interposed therebetween, a plurality of color filters formed in at least one of a location between the second substrate and the organic light emitting elements and a location between the first substrate and the organic light emitting elements, and a disparity barrier pattern formed on at least one of the other surface of the second substrate opposing one surface of the second substrate facing the first substrate, and the other surface of the first substrate opposing one surface of the first substrate facing the second substrate.

The plurality of color filters may be formed on the one surface of the second substrate facing the plurality of organic light emitting elements. The disparity barrier pattern may be formed on the other surface of the second substrate.

The plurality of color filters may be formed between the one surface of the first substrate and the plurality of organic light emitting elements. The disparity barrier pattern may be formed on the other surface of the first substrate.

The plurality of color filters may be divided into a plurality of color filters for the left eye and a plurality of color filters for the right eye.

The disparity barrier pattern may be formed as a stripe type pattern.

The color filters for the left eye and the color filters for the right eye may be sequentially arranged in a direction parallel to the disparity barrier pattern.

The color filters for the left eye and the color filters for the right eye may be alternately arranged in a direction intersecting the disparity barrier pattern.

The disparity barrier pattern may overlap one set of sides of the color filters.

One of the color filters for the left eye may be paired with one of the color filters for the right eye, which is adjacent to the other side of the color filter for the left eye, which does not overlap the disparity barrier pattern.

An image formed by light having passed through the color filters for the left eye and an image formed by light having passed through the color filters for the right eye may be made to be identical to each other to thereby display a two-dimensional image.

An image formed by light having passed through the color filters for the left eye and an image formed by light having passed through the color filters for the right eye may be made to be different from each other to thereby display a three-dimensional image.

At least one of the first substrate and the second substrate, disposed between the disparity barrier pattern and the plurality of color filters, may have a thickness ranging from about 0.1 mm to about 0.7 mm.

The plurality of color filters may include a plurality of colors.

The plurality of organic light emitting elements may emit light of a single color.

The plurality of organic light emitting elements may emit white light.

The OLED display may further include a sealant disposed between edges of the first substrate and the second substrate to bond and seal the first substrate and the second substrate.

The OLED display including any one of the above features, may also include the disparity barrier pattern formed of a conductive material.

The OLED display may further include a touch electrode formed of a conductive material and disposed between the second substrate and the plurality of color filters, and the second substrate, the disparity barrier pattern and the touch electrode may function as a touch screen.

The second substrate, the disparity barrier pattern and the touch electrode may operate as a capacitive overlay type.

According to an exemplary embodiment, the OLED display can effective display a 3D image through a simple configuration.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
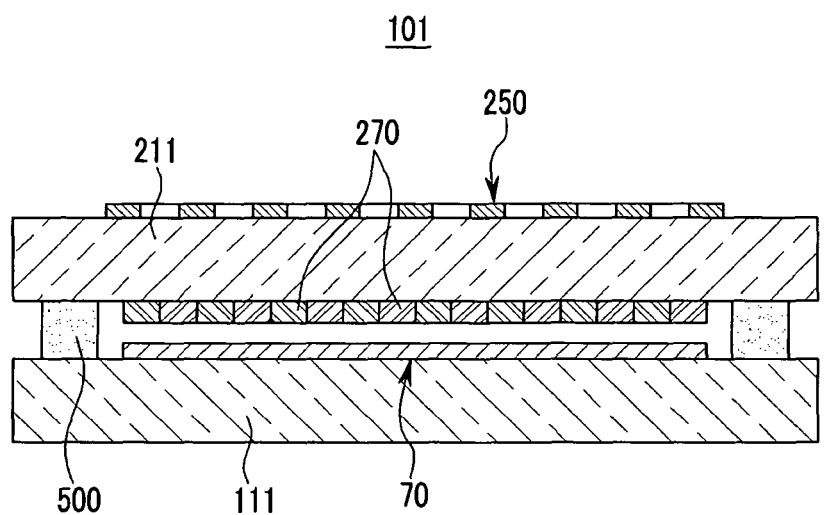
FIG. 1 illustrates a cross-sectional view of an organic light emitting diode (OLED) display, according to an exemplary embodiment.

Korean Patent Application No. 10-2010-0106888, filed on Oct. 29, 2010, in the Korean Intellectual Property Office, and entitled: "Organic Light Emitting Diode Display," is incorporated by reference herein in its entirety.

Embodiments will be described more fully hereinafter with reference to the accompanying drawings, in which exemplary embodiments of the invention are shown. The embodiments may, however, be embodied in different forms and should not be construed as limited to the embodiments set forth herein.

Like reference numerals refer to like elements throughout the specification. Constituent elements having the same configuration are representatively described with reference to a first exemplary embodiment. Other exemplary embodiments may then be described by referring to various differences between the embodiments.

The size and thickness of each of the elements shown in the drawings is arbitrarily shown for better understanding and ease of description, and embodiments are not necessarily limited thereto. In the drawings, the thickness of layers, films, panels, regions, etc., are exaggerated for clarity. The thickness of the layers, films, panels, regions, etc., may be enlarged in the drawings for better understanding and ease of description. It will be understood that when an element such as a layer, film, region, or substrate is referred to as being "on" another element, it can be directly on the other element or intervening elements may also be present.

Referring to FIG. 1, an organic light emitting diode (OLED) display 101 according to a first exemplary embodiment will now be described.

As shown in FIG. 1, the OLED display 101 may include a first substrate 111, an organic light emitting element 70, a second substrate 211, a color filter 270, and a disparity barrier pattern 250. The OLED display 101 may display an image through a plurality of pixel. A single pixel of the plurality of pixels may be considered a minimal unit and may emit light for an image display.

The OLED display 101 may include a sealant 500. The sealant 500 may be disposed between the edges of the first substrate 111 and the second substrate 211. The sealant 500 may bond and seal the first substrate 111 and the second substrate 211. As for the sealant 500, a variety of materials may be used, e.g., a variety of materials and/or sealants known to a person of ordinary skill in the art.

The first substrate 111 may be a transparent insulating substrate, e.g., the first substrate 111 may be formed of e.g., include, at least one of glass, quartz, ceramics, and the like. The first substrate 111 may be a transparent flexible substrate, e.g., the first substrate 111 may be formed of, e.g., include, a plastic and the like. Furthermore, the first substrate 111 may be formed of, e.g., include, a variety of material. For example, the variety of materials may be known in the art, other than the aforementioned materials.

The organic light emitting element 70 may be formed on the first substrate 111. Diverse circuit elements, including a thin film transistor 10 (see FIG. 3), may be formed on the first substrate 111. The organic light emitting element 70 may display an image by, e.g., emitting light according to a driving signal sent from the thin film transistor 10. The organic light emitting element 70 and the thin film transistor 10 driving the same may be configured to have various structures, e.g., various structures known to a person of ordinary skill in the art.

A plurality of organic light emitting elements 70 may be formed corresponding to respective pixels in the plurality of pixels. According to an exemplary embodiment, the plurality of organic light emitting elements 70 may emit light of a single color. For example, the organic light emitting elements 70 may emit white light. In an exemplary embodiment, the organic light emitting elements 70 may emit light in the direction of, e.g., toward, the second substrate 211.

The second substrate 211 may face the first substrate 111. The second substrate 211 may be spaced apart from the first substrate 111, and the organic light emitting elements 70 may be interposed therebetween. Similarly to the first substrate 111, the second substrate 211 may be formed of various materials, e.g., materials known to a person of ordinary skill in the art, such as at least one of glass, quartz, ceramics, plastic, and the like. The second substrate 211 may be transparent and may allow light, e.g., light emitted from the organic light emitting element 70, to pass therethrough.

The disparity barrier pattern 250 may be formed on another surface of the second substrate 211. For example, the disparity barrier pattern 250 may be disposed on a surface opposite a surface of the second substrate 211 that faces the first substrate 111. Namely, the disparity barrier pattern 250 may be formed on the other surface of the second substrate 211 opposing one surface thereof facing the organic light emitting element 70.

Figure 2:
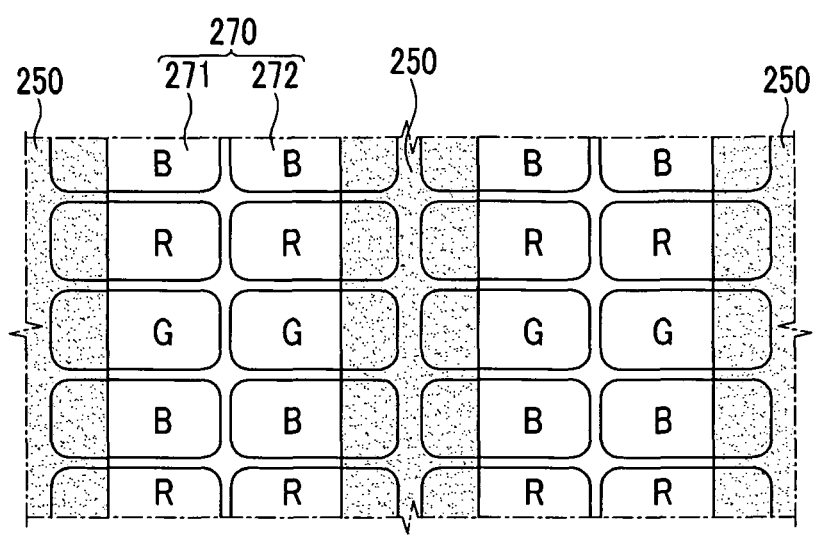
FIG. 2 illustrates a top plan view of a color filter and a disparity barrier pattern of the OLED display illustrated in FIG. 1, according to an exemplary embodiment.

As shown in FIG. 2, the disparity barrier pattern 250 may be formed as a stripe type, e.g., as a stripe type pattern. For example, the disparity barrier pattern 250 may be formed as a stripe type having a length in a direction that intersects the length direction of the plurality of pixels.

Also, the disparity barrier pattern 250 may be formed of various materials, e.g., various materials known to a person of ordinary skill in the art as being capable of blocking light, such as at least one of carbon black, metal, and the like.

The color filter 270 may be formed on the one surface of the second substrate 211 facing the organic light emitting element 70. The color filter 270 may include a plurality of color filters, e.g., corresponding to respective organic light emitting elements 70 of the plurality of organic light emitting elements 70. The plurality of color filters 270 may have a plurality of colors. For example, the color filters 270 may impart color to white light emitted from the organic light emitting elements 70. As shown in FIG. 2, according to an exemplary embodiment, the plurality of color filters 270 include red color filters, green color filters, and blue color filters. The plurality of colors for color filters are not limited thereto. The color filters 270 may be formed of various materials, e.g., variously materials known to a person of ordinary skill in the art.

As shown in FIG. 2, the plurality of color filters 270 may be divided into a plurality of color filters 271, e.g., for the left eye, and a plurality of color filters 272, e.g., for the right eye. For ease of explanation, the color filters 271 are described below as being associated with the left eye, and the color filters 272 are describe below as being associated the right eye. However, embodiments are not limited thereto.

The color filters 271 for the left eye, and the color filters 272 for the right eye, may be sequentially arranged, e.g., sequentially arranged in a direction parallel to the extending direction of the disparity barrier pattern 250. The color filters 271 for the left eye and the color filters 272 for the right eye may be alternately arranged, e.g., alternately arranged in a direction intersecting the extending direction of the disparity barrier pattern 250. The disparity barrier patterns 250 may overlap sides of the color filters 270, e.g., one or more than one set of sides of the color filters 270. For example, the disparity barrier pattern 250 may overlap one side of a single color filter 271 for the left eye and one side of a single color filter 272 for the right eye.

A single color filter 271 for the left eye and a single color filter 272 for the right eye may be paired up, e.g., may be disposed in pairs. The other sides of the pair of color filter 271 for the left eye and color filter 272 for the right eye, which are not overlapped by the disparity barrier pattern 250, may be disposed adjacent to each other. For example, disparity barrier patterns 250 may overlap edges of one pair of color filter 271 and color filter 272. Opposing edges of the color filter 271 and color filter 272 may be adjacent to each other and may not have a disparity barrier pattern 250 thereon.

The color filters 270 and the disparity barrier patterns 250 may be disposed with the second substrate 211 interposed therebetween. For example, a distance between the color filters 270 and the disparity barrier pattern 250 may be determined by the thickness of the second substrate 211. According to an exemplary embodiment, the second substrate 211 may have a thickness in the range of about 0.1 mm to about 0.7 mm. The second substrate 211 may have a thickness range sufficient to render a left-eye image and a right-eye image different.

When the color filters 270 and the disparity barrier pattern 250 are spaced apart from each other as described above, the OLED display 101 may display a three-dimensional (3D) image. While passing through the color filters 270, light emitted from the organic light emitting elements 70 may have color to thereby display an image in color. In this case, the disparity barrier pattern 250 may partially block light having passed through the color filters 270. The disparity barrier pattern 250 may render an image viewed by an observer's left eye different from that viewed by the observer's right eye. That is, a 3D image may be implemented by combining the different two-dimensional left-eye image and the right-eye image, displayed by the OLED display 101.

By the above-described simple configuration, the OLED display 101 may effectively display a 3D image. For example, the OLED display 101 may display a 3D image while minimizing an increase in thickness and/or achieving a simplified configuration.

The OLED display 101 may display a 3D image by making an image, formed by light having passed through the color filters 271 for the left eye, different from an image, formed by light having passed through the color filters 272 for the right eye, in terms of an observer's view.

The OLED display 101 may also display a 2D image by making an image, formed by light having passed through the color filters 271 for the left eye, identical to an image, formed by light having passed through the color filters 272 for the right eye.

Figure 3:
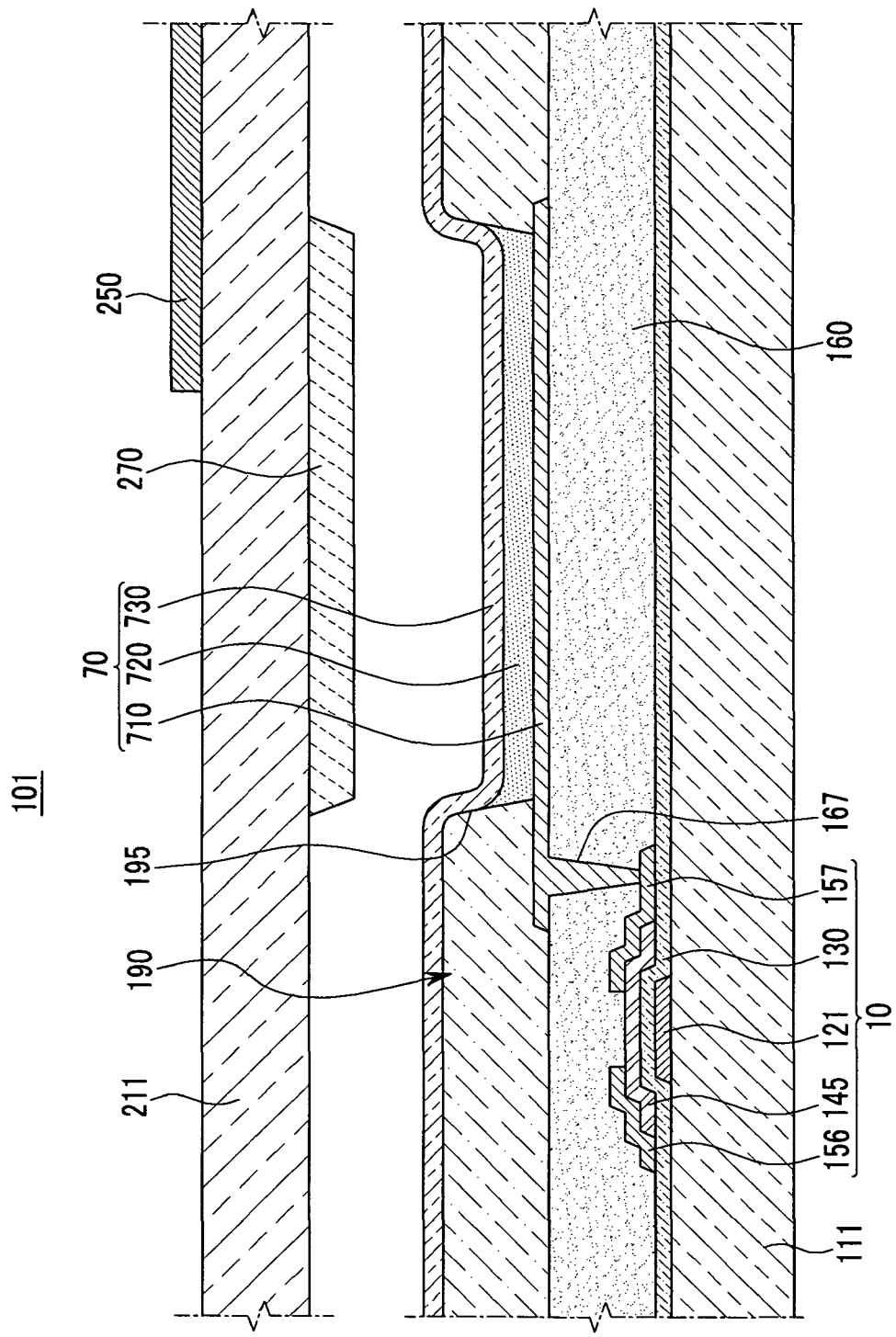
FIG. 3 illustrates a cross-sectional view, on an enlarged scale, of the OLED display illustrated in FIG. 1, according to an exemplary embodiment.

Referring to FIG. 3, the structure of the OLED display 101 according to the an exemplary embodiment will now be described mainly on the thin film transistor 10 and the organic light emitting element 70.

A gate electrode 121 may be formed on the first substrate 111. The gate electrode 121 may include at least one of molybdenum (Mo), chromium (Cr), aluminum (Al), silver (Ag), titanium (Ti), tantalum (Ta), and tungsten (W). However, embodiments are not limited thereto. The gate electrode 121 may be formed of various metals, e.g., materials having excellent electric characteristics.

Although not shown, a buffer layer may be formed between the first substrate 111 and the gate electrode 121. For example, the buffer layer may have a mono-layered structure of, e.g., silicon nitride (SiNx) or a dual-layered structure in which, e.g., silicon nitride (SiNx) and silicon oxide (SiO$_2$) are stacked. The buffer layer may minimize, reduce, and/or prevent the infiltration of unnecessary components such as impurity elements or moisture, and may flatten the surface. The use of the buffer layer may be determined according to the kinds and process conditions of the first substrate 111.

A gate insulating layer 130 may be formed on the gate electrode 121. The gate insulating layer 130 may include, e.g., at least one of tetra ethyl ortho silicate (TEOS), silicon nitride, silicon oxide, and silicon oxynitride. For example, the gate insulating layer 130 may be formed as a dual-layered structure including a silicon nitride layer having a thickness of approximately 40 nm and a TEOS layer having a thickness of approximately 80 nm arranged stacked together.

A semiconductor layer 145 may be formed on the gate insulating layer 130. The semiconductor layer 145 may be formed of a variety of materials, e.g., a variety of materials according to the kind of thin film transistor. The semiconductor layer may be formed of, e.g., at least one of amorphous silicon, polysilicon, oxide semiconductor, and the like.

A source electrode 156 and a drain electrode 157 contacting portions of the semiconductor layer 145 may be formed on the semiconductor layer 145. The source electrode 156 and the drain electrode 157 may be spaced apart from each other.

Like the gate electrode 121, the source electrode 156 and the drain electrode 157 may each include, e.g., at least one of molybdenum (Mo), chromium (Cr), aluminum (Al), silver (Ag), titanium (Ti), tantalum (Ta), and tungsten (W).

As described above, the thin film transistor 10 may includes the gate electrode 121, the semiconductor layer 145, the source electrode 156, and the drain electrode 157.

The OLED display 101 may include at least one thin film transistor, other than the thin film transistor 10 shown in FIG. 3.

In the first exemplary embodiment, the thin film transistor 10 is not limited to the above-described structure. For example, the thin film transistor 10 may have various structures, e.g., various structures known to a person of ordinary skill in the art.

A planarization layer 160 may be formed on the source electrode 156 and the drain electrode 157. The planarization layer 160 may have a contact hole 167. The contact hole 167 may expose a portion of the drain electrode 157. The planarization layer 160 may be formed of, e.g., include, an organic layer having planarizing characteristics. According to circumstances, the planarization layer 160 may be omitted.

A pixel electrode 710 may be formed on the planarization layer 160. The pixel electrode 710 may serve as a hole injection electrode that inject holes into an organic emission layer 720.

A pixel defining layer 190, having an opening 195 exposing at least a part of the pixel electrode 710, is formed on the planarization layer 160. The opening 195 of the pixel defining layer 190 may define a light emitting region of a pixel, e.g., a region in which light is generated.

The organic emission layer 720 may be formed on the pixel electrode 710. A common electrode 730 may be formed on the organic emission layer 720. The common electrode 730 may serve as an electron injection electrode that injects electrons into the organic emission layer 720.

In the first exemplary embodiment, the pixel electrode 710 may be formed as a reflective electrode or a transflective electrode. The common electrode 730 may be formed as a transparent electrode.

The reflective electrode may be made of a metallic material such as at least one of aluminum (Al), nickel (Ni), molybdenum (Mo), gold (Au), platinum (Pt), tungsten (W), copper (Cu), and the like. The transflective electrode may be made by reducing the thickness of a reflective electrode. The transparent electrode may be made by using a material including at least one of indium tin oxide (ITO), indium zinc oxide (IZO), zinc indium tin oxide (ZITO), Gallium Indium Tin Oxide (GITO), Indium Oxide ($In_2O_3$), Zinc Oxide (ZnO), Gallium Indium Zinc Oxide (GIZO), Gallium Zinc Oxide (GZO), Fluorine Tin Oxide (FTO), and Aluminum-Doped Zinc Oxide (AZO)

Due to the configuration as described above, light generated from the organic emission layer 720 may be emitted in the direction of the second substrate 211. That is, the OLED display 101, according to an exemplary embodiment, has a front light emitting structure in which light is emitted in a forward direction to thereby display an image.

The second substrate 211 faces the first substrate 111 so as to cover the organic light emitting element 70. The color filter 270 is formed on the one surface of the second substrate 211 facing the organic light emitting element 70, and the disparity barrier pattern 250 is formed on the other surface of the second substrate 211 opposing the one surface thereof.

Hereinafter, an OLED display 102 according to a second exemplary embodiment will be described with reference to FIG. 4.

Figure 4:
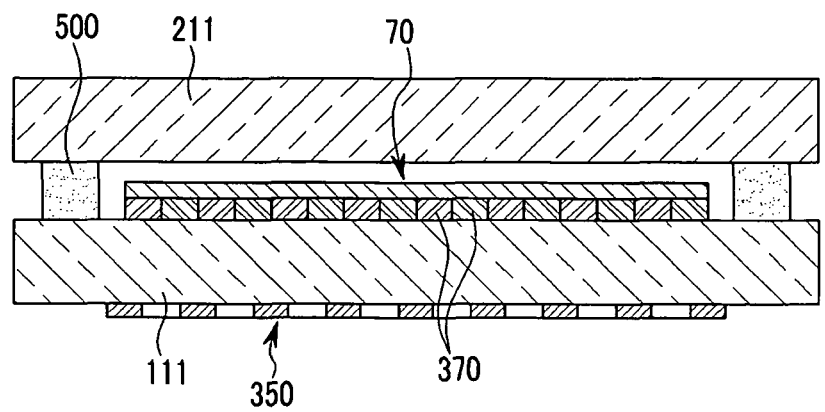
FIG. 4 illustrates a cross-sectional view of an OLED display, according to an exemplary embodiment.

As shown in FIG. 4, a plurality of color filters 370, according to the second exemplary embodiment, are formed between the organic light emitting element 70 and the first substrate 111. A disparity barrier pattern 350 may be formed on the other surface of the first substrate 111, e.g., the surface that opposes one surface thereof facing the organic light emitting element 70. The plurality of color filters 370 and the disparity barrier pattern 350 may be formed to have the first substrate 111 interposed therebetween.

The organic light emitting element 70 may emit light in the direction of the first substrate 111. That is, the OLED display 102 may have a rear light emitting structure in which light is emitted in a rearward direction to thereby display an image. In this case, the pixel electrode 710 (see FIG. 3) of the organic light emitting element 70 may be formed as a transparent electrode, and the common electrode 730 (see FIG. 3) may be formed as a reflective electrode or a transflective electrode.

The OLED display 102, configured as above, may effectively display a 3D image through a simple configuration while having a rear light emitting structure.

Hereinafter, an OLED display 103 according to a third exemplary embodiment will be described.

Figure 5:
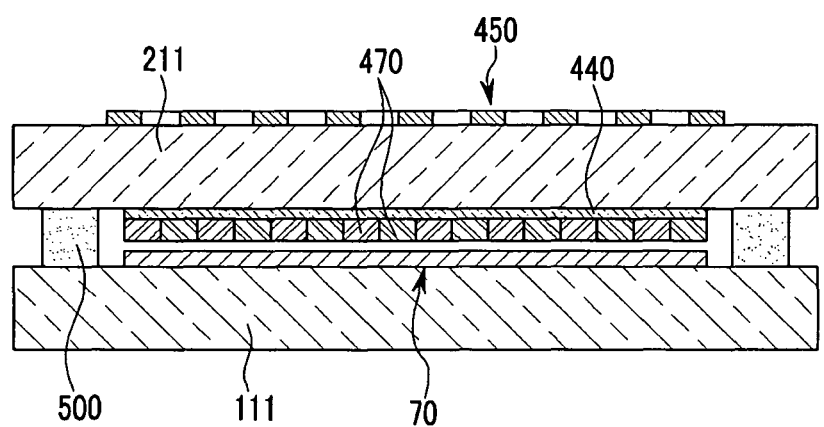
FIG. 5 illustrates a cross-sectional view of an OLED display, according to an exemplary embodiment.

As shown in FIG. 5, the organic light emitting diode (OLED) display 103 further may include a touch electrode 440 disposed between the second substrate 211 and a plurality of color filters 470. The touch electrode 440 may be formed of a transparent conductive material. A disparity barrier pattern 450 may be formed of a conductive material. Here, the touch electrode 440, the second substrate 211, and disparity barrier pattern 450 may function as a touch screen.

In FIG. 5, the touch electrode 440, the second substrate 211, and the disparity barrier pattern 450 may operate as a capacitive overlay type. For example, when voltage is applied to the disparity barrier pattern 450 and the touch electrode 440, respectively, formed on both surfaces of the second substrate 211, high frequency spreading may be caused over the surface of the second substrate 211. When a user's finger or the like contacts the surface of the substrate 211, e.g., a controller may analyze a change in high frequency waveform to recognize a touched point.

However, the third exemplary embodiment is not limited to the above description. The touch electrode 440, the second substrate 211, and the disparity barrier pattern 450 may operate by various methods, e.g., various methods known to a person of ordinary skill in the art, such as an ultrasonic wave method or the like. Further, the touch electrode 440 may be disposed between the disparity barrier pattern and the first substrate 111.

The OLED display 103, configured as above, may effectively display a 3D image through a simple configuration while having a touch screen function.

Embodiments are not limited to the above descriptions. For example, embodiments may include an OLED display that incorporates both the front light emitting structure of OLED display 101 and the rear light emitting structure of OLED display 102. The OLED display having both the front and rear light emitting structures may further include the touch electrode 440 of the OLED display 103.

While embodiments have been particularly shown and described with reference to preferred exemplary embodiments thereof, it will be understood by those skilled in the art that various changes in form and details may be made therein without departing from the spirit and scope of the invention as defined by the appended claims. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated.

What is claimed is:

1. An organic light emitting diode (OLED) display, comprising:
    a first substrate;
    a plurality of organic light emitting elements on the first substrate;
    a second substrate facing the first substrate and spaced apart from the first substrate, the plurality of organic light emitting elements being interposed between the first substrate and the second substrate;
    a plurality of color filters in at least one of an area between the second substrate and the organic light emitting elements and an area between the first substrate and the organic light emitting elements; and
    a disparity barrier pattern on at least one of a surface of the second substrate that opposes one surface of the second substrate facing the first substrate, and a surface of the first substrate that opposes one surface of the first substrate facing the second substrate, wherein:
    the plurality of color filters are divided into a plurality of color filters for the left eye and a plurality of color filters for the right eye, the plurality of color filters for the left eye include first color filters for the left eye having a first color, and the plurality of color filters for the right eye include first color filters for the right eye having the first color, and
    the first color filters for the left eye and the first color filters for the right eye are alternately arranged in a direction intersecting the disparity barrier pattern.

2. The OLED display as claimed in claim 1, wherein:
    the plurality of color filters are on the one surface of the second substrate facing the first substrate such that the plurality of color filters are in the area between the second substrate and the plurality of organic light emitting elements; and
    the disparity barrier pattern is on the surface of the second substrate that opposes the one surface of the second substrate facing the first substrate.

3. The OLED display as claimed in claim 1, wherein:
    the plurality of color filters are on the one surface of the first substrate facing the second substrate such that the plurality of color filters are in the area between the first substrate and the plurality of organic light emitting elements; and the disparity barrier pattern is on the surface of the first substrate that opposes the one surface of the first substrate facing the second substrate.

4. The OLED display as claimed in claim 1, wherein the disparity barrier pattern has a stripe type pattern, and the direction in which the first color filters for the left eye and the first color filters for the right eye are alternatively arranged intersects the stripe type pattern.

5. The OLED display as claimed in claim 4, wherein the color filters for the left eye and the color filters for the right eye are sequentially arranged in a direction parallel to the disparity barrier pattern.

6. The OLED display as claimed in claim 5, wherein others of the color filters for the left eye and others of the color filters for the right eye are alternately arranged in the direction intersecting the disparity barrier pattern.

7. The OLED display as claimed in claim 4, wherein the disparity barrier pattern overlaps one set of sides of adjacent color filters of the plurality of color filters.

8. The OLED display as claimed in claim 7, wherein one of the color filters for the left eye is paired with one of the color filters for the right eye, which is adjacent to the other side of the color filter for the left eye, and which does not overlap the disparity barrier pattern.

9. The OLED display as claimed in claim 7, wherein a first image, formed by light having passed through the color filters for the left eye, and a second image, formed by light having passed through the color filters for the right eye, are identical to each other to display a two-dimensional image.

10. The OLED display as claimed in claim 7, wherein a first image, formed by light having passed through the color filters for the left eye, and a second image, formed by light having passed through the color filters for the right eye, are different from each other to display a three-dimensional image.

11. The OLED display as claimed in claim 1, wherein at least one of the first substrate and the second substrate, disposed between the disparity barrier pattern and the plurality of color filters has a thickness of about 0.1 mm to about 0.7 mm.

12. The OLED display as claimed in claim 1, wherein the plurality of color filters includes a plurality of colors, the plurality of colors including the first color.

13. The OLED display as claimed in claim 12, wherein the plurality of organic light emitting elements emits light of a single color.

14. The OLED display as claimed in claim 12 wherein the plurality of organic light emitting elements emits white light.

15. The OLED display as claimed in claim 1, further comprising a sealant disposed between edges of the first substrate and the second substrate to bond and to seal the first substrate and the second substrate.

16. The OLED display as claimed in claim 1, wherein the disparity barrier pattern includes a conductive material.

17. The OLED display as claimed in claim 16, further comprising a touch electrode that includes a conductive material and that is disposed between the second substrate and the plurality of color filters, the plurality of color filters being in the area between the second substrate and the organic light emitting elements, wherein the second substrate, the disparity barrier pattern, and the touch electrode constitue a touch screen.

18. The OLED display as claimed in claim 17, wherein the second substrate, the disparity barrier pattern, and the touch electrode operate as a capacitive overlay type.

19. The OLED display as claimed in claim 1, wherein:

the plurality of color filters for the left eye further include second color filters for the left eye having a second color and third color filters for the left eye having a third color, the first, second, and third colors being different from each other, the plurality of color filters for the right eye further include second color filters for the right eye having the second color and third color filters for the right eye having the third color, the first color filters for the left eye and the first color filters for the right eye are alternately arranged in a first row in the direction intersecting the disparity barrier pattern, the second color filters for the left eye and the second color filters for the right eye are alternately arranged in a second row in the direction intersecting the disparity barrier pattern, the second row being parallel to the first row, and the third color filters for the left eye and the third color filters for the right eye are alternately arranged in a third row in the direction intersecting the disparity barrier pattern, the third row being parallel to the second row.

20. The OLED display as claimed in claim 19, wherein:

the disparity barrier pattern has a stripe type pattern including a plurality of stripes that are separated from each other in a region overlapping the plurality of organic light emitting elements, and the direction in which each of the first, second, and third rows are arranged intersects each of the plurality of stripes.

* * * * *